United States Patent
Lin

(10) Patent No.: US 6,291,294 B1
(45) Date of Patent: *Sep. 18, 2001

(54) METHOD FOR MAKING A STACK BOTTOM STORAGE NODE HAVING REDUCED CRYSTALLIZATION OF AMORPHOUS POLYSILICON

(75) Inventor: Dahcheng Lin, Hsinchu (TW)

(73) Assignee: Taiwan Semiconductor Manufacturing Corporation, Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/170,861

(22) Filed: Oct. 13, 1998

(51) Int. Cl.⁷ ............... H01L 21/8242; H01L 21/8234; H01L 21/20
(52) U.S. Cl. ................. 438/255; 438/238; 438/398
(58) Field of Search .................. 438/238, 253, 438/255, 381, 396, 398, 795

(56) References Cited

U.S. PATENT DOCUMENTS

| | | | |
|---|---|---|---|
| 5,650,351 | * 7/1997 | Wu | 438/398 |
| 5,681,773 | * 10/1997 | Tseng | 438/398 |
| 5,837,581 | * 11/1998 | Cheng | 438/255 |
| 5,866,455 | * 2/1999 | Wu | 438/255 |
| 5,937,307 | * 8/1999 | Jenq et al. | 438/398 |
| 5,989,969 | * 11/1999 | Watanabe et al. | 438/381 |
| 5,994,181 | * 10/1999 | Hsieh et al. | 438/239 |

\* cited by examiner

Primary Examiner—Trung Dang
Assistant Examiner—Brook Kebede
(74) Attorney, Agent, or Firm—Blakely Sokoloff Taylor & Zafman LLP

(57) ABSTRACT

A method for manufacturing a bottom storage node of a stack capacitor on a substrate is disclosed. The method comprises the steps of: (1) forming a first dielectric layer onto said substrate; (2) forming a nitride layer onto said first dielectric layer; (3) patterning and etching said first dielectric layer and said nitride layer until said substrate is reached, to form a contact opening; (4) forming a first conducting layer into said contact opening and atop said nitride layer; (5) removing a portion of said first conducting layer atop said first dielectric layer to form a plug in said contact opening; (6) forming a second dielectric layer atop said nitride layer and said plug; (7) patterning and etching said second dielectric layer to form a trench above said plug; (8) forming an amorphous polysilicon layer into said trench and atop said second dielectric layer; (9) removing a portion of said amorphous polysilicon layer atop said second dielectric layer; (10) removing remaining portion of said second dielectric layer; and (11) forming an HSG polysilicon layer atop said amorphous polysilicon layer.

6 Claims, 4 Drawing Sheets

METHOD FOR MAKING A STACK BOTTOM STORAGE NODE HAVING REDUCED CRYSTALLIZATION OF AMORPHOUS POLYSILICON

FIELD OF THE INVENTION

The present invention relates to a method for manufacturing dynamic random access memory (DRAM), and more specifically, to a method for manufacturing a stack capacitor using amorphous polysilicon and HSG polysilicon.

BACKGROUND OF THE INVENTION

It has been the trend to scale down the sizes of memory cells to increase the integration level and thus memory capacity of a DRAM chip. As the size of DRAMs is decreased, the capacity of the capacitor used in the DRAM is correspondingly decreased.

A memory cell of DRAM typically consists of a storage capacitor and an access transistor. With the advent of large-scale integrated DRAM devices, the size of the devices has gotten smaller and smaller such that the available area for a single memory cell has become very small. This causes a reduction in the capacitor's area, resulting in the reduction of the cell's capacitance.

One method for increasing capacitance area involves forming hemispherical grain (HSG) polysilicon on amorphous polysilicon and increasing capacitor height. However, increasing capacitor height requires an increase in the amorphous polysilicon layer which requires an increased deposition time for the amorphous polysilicon layer. An increased deposition time causes crystallization of the amorphous polysilicon. Crystallization of the amorphous polysilicon inhibits silicon migration resulting in poor HSG formation atop the amorphous polysilicon. For amorphous silicon deposition, mono-silane ($SiH_4$) is the reactant gas most frequently used. Although using di-silane ($Si_2H_6$) reduces the deposition time, changing existing equipment required is costly.

Therefore, there is a need for an improved method for manufacturing a stack capacitor that reduces crystallization of the amorphous polysilicon and that can be used with existing equipment.

SUMMARY OF THE INVENTION

A method for manufacturing a bottom storage node of a stack capacitor on a substrate is disclosed. The method comprises the steps of: (1) forming a first dielectric layer onto said substrate; (2) forming a nitride layer onto said first dielectric layer; (3) patterning and etching said first dielectric layer and said nitride layer until said substrate is reached, to form a contact opening; (4) forming a first conducting layer into said contact opening and atop said nitride layer; (5) removing a portion of said first conducting layer atop said first dielectric layer to form a plug in said contact opening; (6) forming a second dielectric layer atop said nitride layer and said plug; (7) patterning and etching said second dielectric layer to form a trench above said plug; (8) forming an amorphous polysilicon layer into said trench and atop said second dielectric layer; (9) removing a portion of said amorphous polysilicon layer atop said second dielectric layer; (10) removing remaining portion of said second dielectric layer; and (11) forming an HSG polysilicon layer atop said amorphous polysilicon layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method for making a stack capacitor having increased cell capacitance and increased throughout.

Figure 1A:
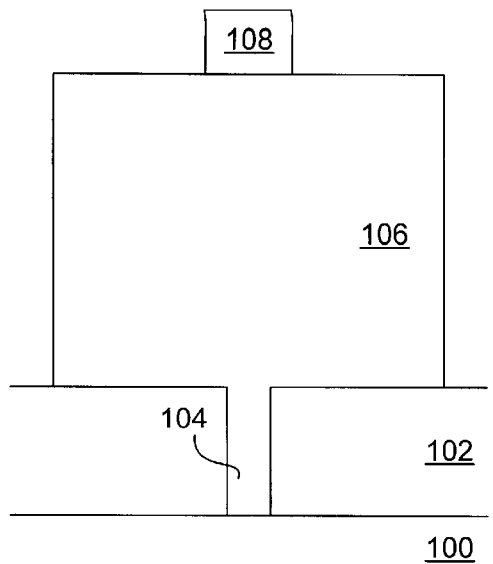
FIGS. 1A–1C show cross-sectional views of a semiconductor substrate, illustrating the steps of forming a stack storage node using a prior art method.
Figure 1B:
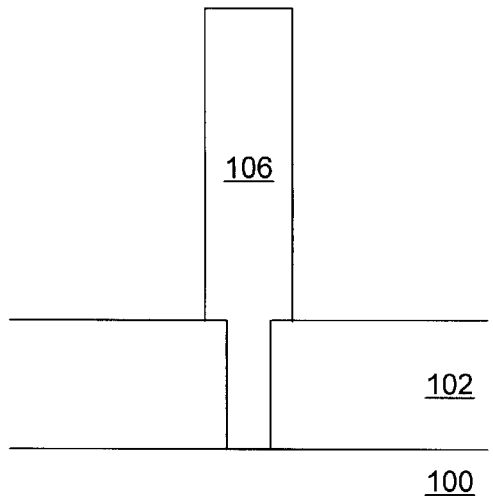
Figure 1C:
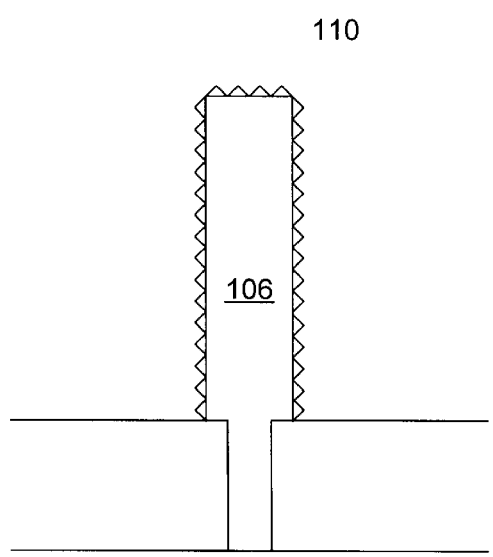

Turning to FIG. 1A, in a prior art method, a dielectric layer 102 is formed atop a substrate 100. A contact opening 104 is made. Amorphous polysilicon 106 is formed atop the dielectric layer 102. The amorphous polysilicon layer 106 is etched, using a photoresist layer 108 as a mask. After the photoresist layer 108 is removed, the resulting structure is shown in FIG. 1B. Hemispherical grain (HSG) polysilicon 110 is formed on the amorphous polysilicon 106 to complete the bottom storage node as shown in FIG. 1C.

In this prior art method, the capacitance area is increased by increasing the thickness of the amorphous polysilicon layer 106 to increase the height of the stack bottom storage node. However, increasing the thickness of the amorphous polysilicon layer 106 requires a longer deposition time for the amorphous polysilicon layer 106. The longer deposition time causes crystallization of the amorphous polysilicon layer 106, resulting in poor formation of HSG polysilicon 110.

Figure 2:
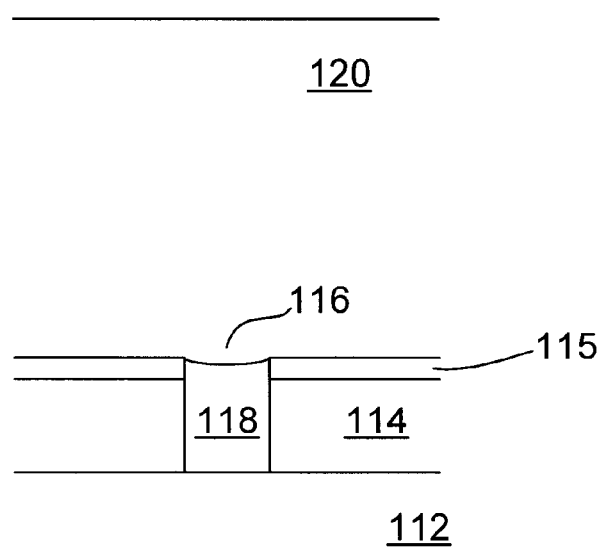
FIGS. 2–7 show cross-sectional views of a semiconductor substrate, illustrating the present invention for forming a stack bottom storage node of a capacitor.

Turning to the present invention, beginning with FIG. 2, a semiconductor substrate 112 is shown. The substrate is understood to possibly include a semiconductive wafer, active and passive devices formed within the wafer, and layers formed on the wafer's surface. The term "substrate" is meant to include devices formed within a semiconductor wafer and the layers overlying the wafer.

In FIG. 2, a first dielectric layer 114 is formed atop the substrate 112. The first dielectric layer 114 may be formed from silicon oxide, borophosilicate glass (BPSG), spin-on-glass (SOG), or any combination thereof The thickness of the first dielectric layer 114 is preferably about 1,000 to 2,000 angstroms. Next, a silicon nitride layer 115 is formed atop the first dielectric layer 114 by using conventional techniques. In the preferred embodiment, the silicon nitride layer 115 is deposited by low pressure chemical vapor deposition (LPCVD), using $SiH_2Cl_2$ as the source of deposition, at a temperature of between about 700 to 800° C., at a pressure of between about 0.1 to 1 torr. The thickness of the silicon nitride layer 115 is between about 50 to 200 angstroms. The silicon nitride layer 115 is formed for use as an etching stop layer.

Next, a contact opening 116 is made using conventional photolithography and etching techniques. The etching is controlled to stop when the substrate 112 is reached. Moreover, the contact opening 116 is typically disposed over the drain of the access transistor of a DRAM cell.

An in-situ doped polysilicon layer is deposited into the contact opening 116 and atop the first dielectric layer 114, preferably by conventional chemical vapor deposition (CVD). The polysilicon layer is then etched, preferably by using either reactive ion etching (RIE) or chemical mechanical polishing (CMP). The etching is stopped when the silicon nitride layer 115 is reached, leaving a polysilicon plug 118 in the contact opening 116. A second dielectric layer 120 is deposited atop the silicon nitride layer 115 and said polysilicon plug 118. The second dielectric layer 120 may be formed from silicon oxide, borophosilicate glass (BPSG), spin-on-glass (SOG), or any combination thereof The thickness of the second dielectric layer 120 is preferably about 4000 to 15000 angstroms.

Figure 3:
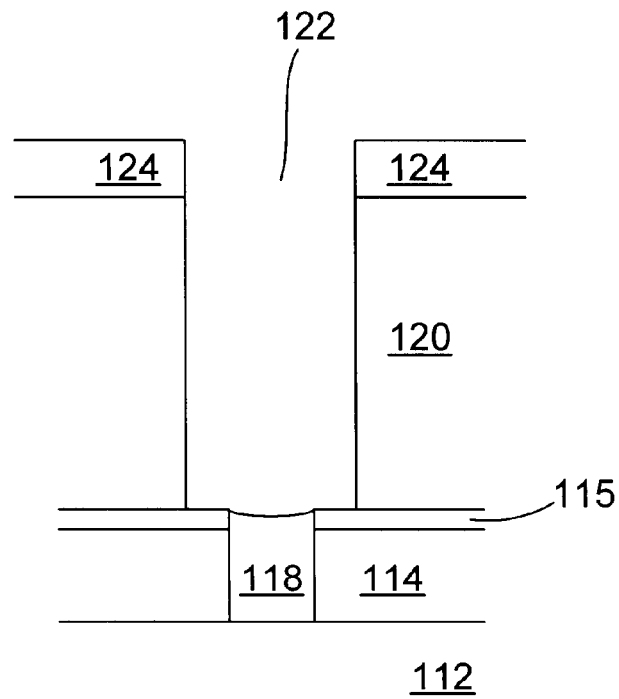

Turning to FIG. 3, a trench 122 is made in the second dielectric layer 120 using conventional photolithography and etching techniques. For example, a photoresist layer 124 may be deposited over the second dielectric layer 120. Next, the photoresist layer 124 is patterned and developed to expose the trench 122. Using the silicon nitride layer 115 as an etching stop, the second dielectric layer 120 is etched. The photoresist layer 124 is then stripped.

Figure 4:
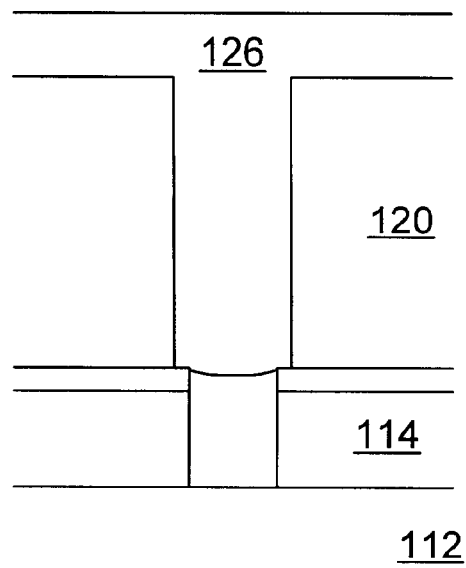

Turning to FIG. 4, an amorphous polysilicon layer 126 is deposited into the trench 122 and atop the second dielectric layer 120 using any known conventional technique, such as the use of mono-silane or di-silane as the reactant gas. Preferably, the thickness of the amorphous polysilicon layer 126 atop the second dielectric layer 120 is about 3000 angstroms. A deposition temperature of the amorphous polysilicon layer 126 is preferably below 550° C. Alternatively, this layer 126 can be insitu doped silicon, in which the phosphorous concentration is about 2E20 atoms/cm$^3$.

Figure 5:
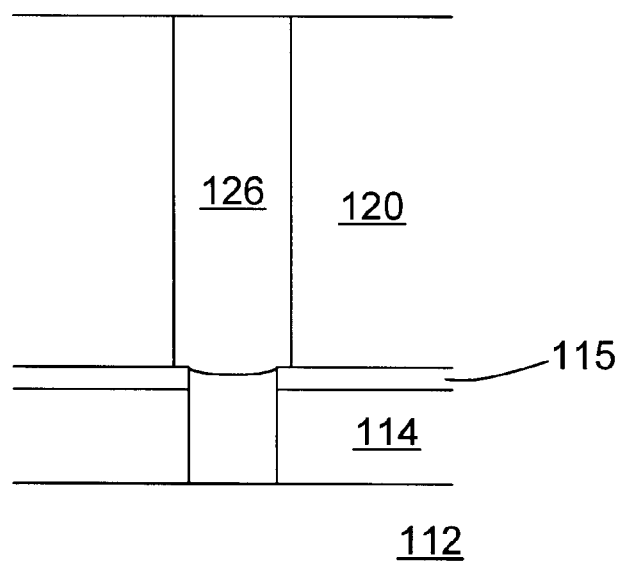

Turning to FIG. 5, the portion of the amorphous polysilicon layer 126 atop the second dielectric layer 120 is removed using conventional etching techniques or by chemical mechanical polishing (CMP).

Figure 6:
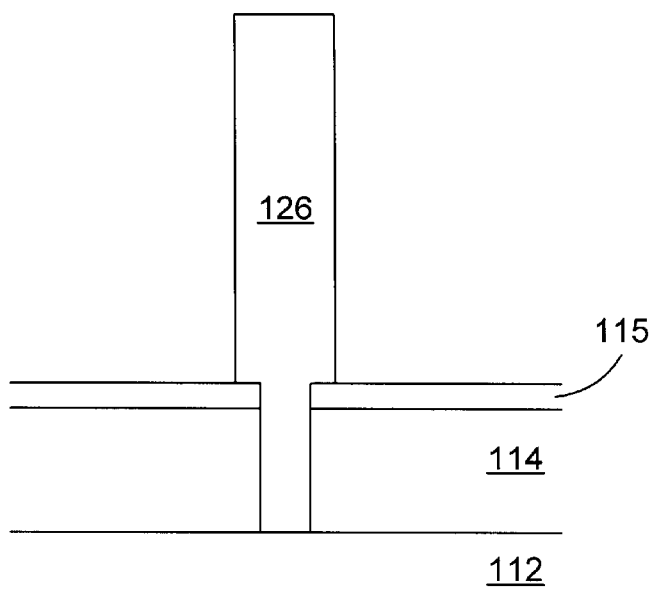

Turning to FIG. 6, the remaining second dielectric layer 120 is removed by any conventional technique. For example, the second dielectric layer 120 may be removed by a conventional oxide wet etch. The etchant used may be a dilute HF solution.

Figure 7:
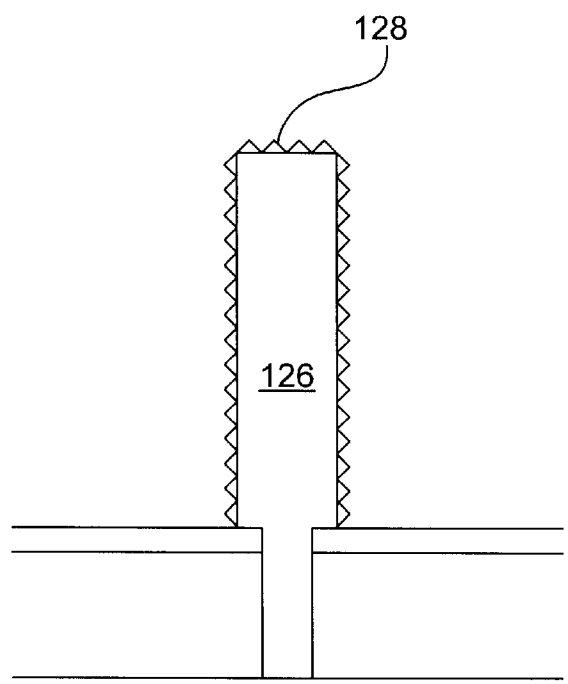

Turning to FIG. 7, hemispherical grain (HSG) polysilicon 128 is formed over the amorphous polysilicon layer 126. The HSG polysilicon 128 is formed by a high vacuum anneal. An anneal temperature of the high vacuum is preferably between 560 and 660° C. Preferably, the HSG polysilicon 128 is formed using a seeding and high vacuum technique. In summary, silane or di-silane is used to seed the surface of the amorphous polysilicon 126. In this manner, the bottom storage node is formed.

Finally, a conventional deposition of a dielectric layer and a top storage node is performed to complete the capacitor. These conventional "finishing" steps are known in the art and will not be discussed further herein.

The present invention increases throughput and also reduces or eliminates crystallization of the amorphous polysilicon 126 to improve HSG polysilicon growth. This is accomplished by shortening the deposition time for the amorphous polysilicon layer. The amorphous polysilicon is formed along the walls of the trench 122 defined by the sidewalls of the second dielectric layer 120. Therefore, the deposition time depends on the width of the trench 122, rather than on the height (or thickness) of the amorphous polysilicon layer. The stack width is shorter than the stack height, which translates to a shorter deposition time. Furthermore, the trend is to further decrease the width and further increase the height of the stack to scale down the size of the capacitor. Therefore, the deposition time for the amorphous polysilicon layer under the present invention will be further reduced relative to the deposition time under the prior art method.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a stack bottom storage node of a capacitor on a substrate, the method comprising:

forming a first dielectric layer onto said substrate;

forming a nitride layer onto said first dielectric layer;

patterning and etching said first dielectric layer and said nitride layer until said substrate is reached, to form a contact opening;

forming a conducting plug in said contact opening;

forming a second dielectric layer atop said nitride layer and said conducting plug;

patterning and etching said second dielectric layer to form a trench above said plug;

forming an amorphous silicon layer into said trench such that said trench is completely filled by said amorphous silicon;

removing the remaining portion of said second dielectric layer; and forming a HSG polysilicon layer atop said amorphous silicon layer.

2. The method of claim 1, wherein said first dielectric layer and said second dielectric layer are formed of silicon oxide, borophosilicate glass (BPSG), spin-on-glass (SOG), or any combination thereof.

3. The method of claim 1, wherein said conducting plug is formed of in-situ doped polysilicon.

4. The method of claim 1, wherein said nitride layer is formed of silicon nitride.

5. The method of claim 1, wherein said polysilicon layer is insitu doped silicon.

6. The method of claim 1 further including the steps of depositing a third dielectric layer over said bottom storage node; and forming a top storage node over said third dielectric layer.

* * * * *